United States Patent [19]

Kubota et al.

[11] Patent Number: 5,324,053
[45] Date of Patent: Jun. 28, 1994

[54] ELECTROSTATIC CHUCK

[75] Inventors: Yoshihiro Kubota; Makoto Kawai; Shinji Kojima, all of Gunma, Japan

[73] Assignee: Shin-Etsu Chemical Co., Ltd., Tokyo, Japan

[21] Appl. No.: 2,925

[22] Filed: Jan. 11, 1993

[30] Foreign Application Priority Data

Feb. 20, 1992 [JP] Japan ................................. 4-070162

[51] Int. Cl.$^5$ ....................... B25B 11/00; H01F 15/02
[52] U.S. Cl. ...................................... 279/128; 269/8; 361/234
[58] Field of Search ........................... 279/128; 269/8; 361/234

[56] References Cited

U.S. PATENT DOCUMENTS 4,480,284 10/1984 Tojo et al. .................... 361/230 X

FOREIGN PATENT DOCUMENTS

| 304946 | 12/1990 | Japan | 279/128 |
| 34952 | 2/1992 | Japan | 279/128 |
| 206948 | 7/1992 | Japan | 279/128 |
| 296040 | 10/1992 | Japan | 279/128 |

*Primary Examiner*—Steven C. Bishop
*Attorney, Agent, or Firm*—McAulay Fisher Nissen Goldberg & Kiel

[57] ABSTRACT

An improvement is proposed in an electrostatic chuck having a chuck head comprising an electrode layer sandwiched between a backing insulating layer and a frontal insulating layer, which comes into contact with a work piece when the electrostatic chuck is working, by which the electrostatic chuck can exhibit a large electrostatic attractive force by increasing the voltage applied between the electrodes without the problem of dielectric breakdown in the insulating layer and a leak current occurring on the surface of the work piece. The improvement can be obtained by forming the frontal insulating layer in a two-layered structure consisting of a high-dielectric layer made from a material having a dielectric constant of at least 50 at a temperature of 20° C. and a frequency of 1 MHz and a high-resistivity layer made from a material having a volume resistivity of at least $1 \times 10^{12}$ ohm.cm at 20° C., the high-dielectric layer being interposed between the electrode layer and the high-resistivity layer.

5 Claims, No Drawings

ELECTROSTATIC CHUCK

BACKGROUND OF THE INVENTION

The present invention relates to an improved electrostatic chuck or, more particularly, to an improved electrostatic chuck capable of exhibiting a greatly enhanced attractive force to a work piece without a disadvantage of leak currents or dielectric break-down even when the voltage applied to the electrodes is increased.

It is a trend in recent years that the manufacturing process of various kinds of semiconductor devices, liquid crystal display units and the like in the electronic industry involves an increasing number of steps undertaken heretofore in a wet process which, however, are continuously being replaced with steps of a dry process such as the CVD process, sputtering, ion plating and the like in view of the good adaptability to automatization of the process as well as a decrease in the problem of environmental pollution unavoidably caused by the waste liquids used in a wet process. In most of these dry-process treatments of work pieces such as semiconductor silicon wafers, the work piece is worked in a vacuum chamber. In view of the increasing size of the work pieces such as semiconductor silicon wafers, glass plates and the like and the increasing fineness of working on these work pieces as in the patterning works in the manufacture of LSIs to obtain a greatly increased density of circuit integration, it is an essential requirement that the work piece in the vacuum chamber is positioned or transferred with extremely high precision under holding by a precision chucking means.

A traditional chucking means to hold and transfer a work piece is a so-called vacuum chuck in which the work piece is attracted to a chuck head having perforations connected to a suction means such as a vacuum pump to produce a pressure difference between the surfaces of the work piece. As is readily understood from the above mentioned principle, vacuum chucks cannot be used inside of a vacuum chamber because no pressure difference can be produced thereby between the surfaces of a work piece. Although a vacuum chuck can be used under a non-vacuum condition, in addition, vacuum chucks have an inherent problem as a chucking means of a work piece for which extremely high precision is required in working because the attractive force to the work piece is localized at the sucking perforations and not distributed evenly over the whole surface of the chuck head so that a localized stress is caused in the work piece. Accordingly, vacuum chucks cannot be used in a fine working process in the manufacture of electronic devices.

In view of the above described unavoidable problems, vacuum chucks as a means to hold and transfer a work piece are under continuous replacement in recent years with so-called electrostatic chucks, in which the attractive force to the work piece is produced by the static electricity accumulated in the electrodes of the chuck head. By utilizing the feature of electrostatic chucks that the attractive force can be increased as desired by increasing the voltage applied between the electrodes, a study is now under way to use an electrostatic chuck with an object of flatness correction of work pieces such as silicon wafers and glass plates as a substrate of electronic devices, for which an extremely high flatness of the surface is required.

Needless to say, correction of the flatness of a work piece can be effected only by applying a very high attractive force to the work piece. As is known, the electrostatic attractive force f of an electrostatic chuck is given by the equation $$f = A \cdot \epsilon (E/t)^2,$$

in which f is the electrostatic force, A is a constant, $\epsilon$ is the dielectric constant of the insulating material interposed between the work piece and the electrodes, E is the voltage applied between the electrodes and t is the thickness of the insulating layer interposed between the work piece and the electrodes. As is shown by this equation, the electrostatic force f can be increased by increasing the applied voltage E, by decreasing the thickness t of the insulating layer and by using an insulating material having an as high as possible dielectric constant $\epsilon$. It is, however, not always possible to satisfy all of these requirements simultaneously. For example, insulating materials having a high dielectric constant generally have a relatively low volume resistivity so that satisfactory insulation can be obtained only by increasing the thickness t of the insulating layer since otherwise a leak current is caused through the work piece or between the fine circuits thereon eventually leading to a damage to the device or circuit under application of a sufficiently high voltage E to cancel the advantage obtained by the use of a highly dielectric material.

A remedial measure in this regard is proposed in Japanese Patent Kokai 62-94953 according to which the insulating material to form the insulating layer is blended with fine particles of a material having a high dielectric constant though with a relatively low volume resistivity such as titanium dioxide, lead titanate and the like dispersed therein. Such a composite insulating material is not always quite satisfactory because, when the content of the highly dielectric material is increased, the withstand voltage of the insulating layer as a whole is greatly decreased so that the device or the circuit on the work piece attracted to the chuck head is sometimes damaged by the electric discharge caused by the dielectric breakdown or leak current on the surface of the chuck head.

SUMMARY OF THE INVENTION

The present invention accordingly has an object to provide an improved electrostatic chuck capable of working to exhibit a high electrostatic attractive force without the troubles due to dielectric breakdown or leak current unavoidable when a high voltage is applied to a conventional electrostatic chuck.

Thus, the present invention provides an improvement, in an electrostatic chuck having a chuck head comprising an electrode layer sandwiched between a frontal insulating layer and a backing insulating layer, which comprises forming the frontal insulating layer, which comes into contact with a work piece attracted thereto when the electrostatic chuck is working, in a double-layered structure consisting of a high-dielectric layer made from a highly dielectric material having a dielectric constant of at least 50 at a temperature of 20° C. in a frequency of 1 MHz and having a volume resistivity not exceeding $10^{15}$ ohm·cm and a high-resistivity layer made from a highly resistive material having a volume resistivity of at least $1 \times 10^{12}$ ohm.cm at a temperature of 20° C. and having a dielectric constant not exceeding 10 at a temperature of 20° C. in a frequency of 1 MHz, the high-dielectric layer being interposed between the electrode layer and the high-resistivity layer.

DETAILED DESCRIPTION OF THE PREFERRED EMBODIMENTS

As is understood from the above given definition, the characteristic feature of the improved electrostatic chuck of the invention consists in the double-layered structure of the frontal insulating layer, which is the layer sandwiching the electrode layer with the backing insulating layer and coming into contact with an work piece attracted to the chuck head of the working electrostatic chuck. Namely, the frontal insulating layer has a double-layered structure consisting of a high-dielectric layer and a high-resistivity layer, the former layer being sandwiched between the electrode layer and the high-resistivity layer.

The electrode or electrodes, to which a voltage is applied to generate an electrostatic attractive force, can be made from a suitable metallic material such as copper, aluminum, titanium, molybdenum, tungsten and the like without particular limitations provided that the metallic material is resistant against adverse conditions under which the electrostatic chuck is used. The electrode is formed on one of the insulating layers sandwiching the same by a known method including the screen printing method using an electroconductive paint, thermal spraying method using the metal, photolithographic patterning method, electrolytic or electroless plating method and so on. When the electrostatic chuck head is designed in the single-electrode type, the work piece to be attracted thereto is expected to serve as the counterelectrode. It is, however, preferable that the chuck head is designed in the dualelectrode type in which two oppositely facing electrodes are formed in a plane of the electrode layer sandwiched between the two insulating layers.

The high-dielectric layer, which is interposed between the electrode layer and the high-resistivity layer, is made from a material having an as high as possible dielectric constant of, for example, at least 50 at a temperature of 20° C. in a frequency of 1 MHz. The volume resistivity of this high-dielectric material has no particular upper limit or rather the volume resistivity thereof should be as high as possible although a high-dielectric material having a volume resistivity exceeding $10^{15}$ ohm.cm can hardly be obtained. Examples of suitable high-dielectric materials include barium titanate, lead titanate, zirconium titanate, PLZT and the like.

The high-dielectric layer should have a thickness in the range from 1 $\mu$m to 4 mm or, preferably, in the range from 0.3 to 0.8 mm in consideration of the balance between the effective dielectric constant of the frontal insulating layer as a whole and the electrostatic attractive force which is inversely proportional to the square of the thickness thereof. The above named high-dielectric material in the form of a powder can be shaped into a thin sheet having such a thickness by sintering and the sintered sheet is bonded to the electrode layer by a known method such as adhesive bonding by use of an adhesive. When the electrodes are formed from a refractory metal such as molybdenum and tungsten, the sintered dielectric sheet can be bonded to the electrode layer by baking under pressure at a high temperature.

The material of the high-resistivity layer, which sandwiches the above described high-dielectric layer with the electrode layer, is not particularly limitative provided that the volume resistivity thereof is at least $1 \times 10^{12}$ ohm.cm or, preferably, at least $10^{15}$ ohm.cm at 20° C. Although it is desirable that the high-resistivity material has a dielectric constant as high as possible, a high-resistivity material having a dielectric constant of 50 or larger can hardly be obtained. Examples of suitable high-resistivity materials include polymeric materials such as polyimide resins, epoxy resins, phenolic resins and the like and ceramic materials such as alumina, aluminum nitride, zirconia, silica, boron nitride, Sialon and the like either singly or as a blend of two kinds or more. In respect of the high resistance against the corrosive atmosphere encountered in the process of dry etching as well as thermal stability, ceramic materials are preferred to the polymeric materials for the high-resistivity layer. The backing insulating layer can be formed from the same high-resistivity ceramic material.

The high-resistivity layer should have a thickness in the range from 1 $\mu$m to 4 mm or, preferably, in the range from 0.3 to 0.8 mm in consideration of the balance between the increase in the insulation and a decrease of the attractive force caused by increasing the thickness. When the thickness of the high-resistivity layer is too small, namely, the frontal insulating layer is subject to eventual dielectric breakdown so as to cause a damage on the work piece if not to mention the low mechanical strength of the high-resistivity layer and the difficulty in forming such a very thin layer, especially, when the material is a ceramic material. When the thickness of the hi h-resistivity layer is too large, on the other hand, the overall thickness of the frontal insulating layer is increased so much that the electrostatic force, which is inversely proportional to the square of the thickness thereof, is decreased accordingly. The high-resistivity layer can be formed and bonded to the high-dielectric layer by any conventional method. For example, a sheet of a polymeric resin or a ceramic material formed in advance is adhesively bonded to the high-dielectric layer by using an adhesive. When the high-resistivity material is a ceramic material, a convenient and reliable method is that green sheets of, one, the high-dielectric material and, the other, the high-resistivity ceramic material are prepared from the respective powders and the green sheets are laid one on the other and subjected to co-sintering under pressure at a high temperature so that an integral double-layered ceramic sheet can be obtained.

Since the thickness of the electrostatic chuck head according to the invention, which consists of an eleectrode layer sandwiched between the frontal and backing insulating layers, cannot be large enough to ensure good mechanical strengths required in handling, it is usual that the chuck head is mounted on a rigid base having a sufficiently large thickness and mechanical strength. Examples of suitable materials of the chuck base include ceramic materials such as alumina, zirconia, silica, aluminum nitride, boron nitride, Sialon and the like and metallic materials such as aluminum, copper, stainless steel and the like.

In the following, the improved electrostatic chuck of the invention is illustrated in more detail by way of examples and comparative examples.

EXAMPLE AND COMPARATIVE EXAMPLES

A slurried mixture was prepared by admixing 100 parts by weight of a powder mixture -consisting of 95% by weight of an aluminum oxide powder, 3% by weight of a silica powder and 2% by weight of a magnesium oxide powder with 8 parts by weight of a butyral resin, 50 parts by weight of trichloroethylene and 10 parts by weight of ethyl alcohol followed by mixing for 35 hours in a ball mill.

The solvents were partially evaporated from the slurried mixture in a vacuum deaerator so that the slurry had a consistency of 38,000 centipoise. Two ceramic green sheets having a thickness of 2 mm and 0.7 mm were shaped from the slurry by using a doctor blade and the green sheets were cut each to give a circular disc of 180 mm diameter. The green sheet disc having a thickness of 2 mm was provided on one surface by the screen printing method using a tungsten paste concentrically with two annular electrodes of which the outer elecrrode had an inner diameter of 102 mm and an outer diameter of 140 mm and the inner electrode had an inner diameter of 20 mm and an outer diameter of 100 mm.

Separately, a high-dielectric ceramic green sheet disc having a diameter of 180 mm and a thickness of 1 mm was prepared in substantially the same manner as described above excepting replacement of the powder mixture of aluminum oxide, silica and magnesium oxide with the same amount of a powder of barium titanate.

The 2 mm thick green ceramic disc was overlaid successively with the high-dielectric green sheet disc of barium titanate and the 0.7 mm thick alumina-based green ceramic sheet disc on the surface provided with the printed electrodes and the thus obtained laminated body was integrated by pressing at 100° C. and then subjected to sintering at 1650° C. for 9 hours in an atmosphere of a 20:80 by volume gaseous mixture of hydrogen and nitrogen. The high-dielectric layer as sintered had a dielectric constant of 50 at a temperature of 20° C. and a frequency of 1 MHz and the aluminabased ceramic layer as sintered had a volume resistivity of $2\times10^{14}$ ohm.cm at 20° C. The thus obtained sintered body was ground by about 0.1 mm on both surfaces and the 20 mm wide margin was cut off using a laser-beam cutting machine so as to give a disc of 140 mm diameter. Two lead wires were bonded to the outer and inner electrodes by using an electroconductive adhesive through the small openings formed in the 2 mm thick ceramic backing layer to complete an electrostatic chuck.

The lead wires of this electrostatic chuck were connected to a direct-current power source and a voltage of 600 volts was applied therebetween to attract a-0.6 mm thick semiconductor silicon wafer of 6 inches diameter. The electrostatic attractive force was measured by using an electrostatic force tester to give a value of 28 g/cm$^2$ at room temperature. This attractive force was sufficiently high for the purpose of flatness correction of the silicon wafer.

A comparative electrostatic chuck was prepared in the same manner as above excepting omission of the high-insulating alumina-based layer of 0.7 mm thickness and subjected to the test of the electrostatic attractive force to find occurrence of a leak current between the electrodes when the voltage applied therebetween was increased to 500 volts.

Another comparative electrostatic chuck was prepared in the same manner as above excepting replacement of the high-dielectric layer of barium titanate with an alumina-based sintered ceramic layer of the same thickness and subjected to the test of the electrostatic force to find that the electrostatic attractive force was only 1.5 g/cm$^2$ when the applied voltage was 600 volts.

What is claimed is:

1. In an electrostatic chuck having a chuck head comprising an electrode layer sandwiched between a backing insulating layer and a frontal insulating layer coming into contact with a work piece when the electrostatic chuck is working, the improvement which comprises: forming the frontal insulating layer in a double-layered structure consisting of a high-dielectric layer made from a highly dielectric material having a dielectric constant of at least 50 at a temperature of 20° C. and at a frequency of 1 MHz and having a volume resistivity not exceeding $10^{15}$ ohm.cm and a high-resistivity layer made from a highly resistive material having a volume resistivity of at least $1\times10^{12}$ ohm.cm at a temperature of 20° C. and having a dielectric constant not exceeding 10 at a temperature of 20° C. and at a frequency of 1 MHz, the high-dielectric layer being interposed between the electrode layer and the high-resistivity layer.

2. The improvement as claimed in claim 1 in which the high-dielectric layer has a thickness in the range from 0.3 to 0.8 mm.

3. The improvement as claimed in claim 1 in which the high-resistivity layer has a thickness in the range from 0.3 to 0.8 mm.

4. The improvement as claimed in claim 1 in which the highly dielectric material is selected from the group consisting of barium titanate, lead titanate, zirconium titanate and PLZT.

5. The improvement as claimed in claim 1 in which the highly resistive material is a ceramic material.

* * * * *